US008150900B2

(12) United States Patent
Golic (10) Patent No.: US 8,150,900 B2
(45) Date of Patent: Apr. 3, 2012

(54) RANDOM NUMBER GENERATION BASED ON LOGIC CIRCUITS WITH FEEDBACK

(75) Inventor: Jovan Golic, Turin (IT)

(73) Assignee: Telecom Italia S.p.A., Milan (IT)

( * ) Notice: Subject to any disclaimer, the term of this patent is extended or adjusted under 35 U.S.C. 154(b) by 1365 days.

(21) Appl. No.: 11/659,715

(22) PCT Filed: Aug. 9, 2004

(86) PCT No.: PCT/EP2004/051746
§ 371 (c)(1),
(2), (4) Date: Feb. 8, 2007

(87) PCT Pub. No.: WO2006/015624
PCT Pub. Date: Feb. 16, 2006

(65) Prior Publication Data
US 2007/0273408 A1    Nov. 29, 2007

(51) Int. Cl.
*G06F 7/58* (2006.01)
(52) U.S. Cl. ........................................ 708/250; 708/251
(58) Field of Classification Search ........................ None
See application file for complete search history.

(56) References Cited

U.S. PATENT DOCUMENTS

| | | | |
|---|---|---|---|
| 3,790,768 A | 2/1974 | Chevalier et al. | |
| 3,875,528 A | 4/1975 | Hirsch | |
| 4,202,051 A | 5/1980 | Davida et al. | |
| 4,641,102 A | 2/1987 | Coulthart et al. | |
| 4,799,259 A | 1/1989 | Ogrodski | |
| 4,855,690 A | 8/1989 | Dias | |
| 4,905,176 A | 2/1990 | Schulz | |
| 5,570,307 A | 10/1996 | Takahashi | |
| 6,240,432 B1 | 5/2001 | Chuang et al. | |
| 6,581,078 B1 | 6/2003 | Liardet | |
| 6,631,390 B1 | 10/2003 | Epstein | |
| 2002/0156819 A1* | 10/2002 | Oerlemans | 708/252 |

(Continued)

FOREIGN PATENT DOCUMENTS

EP    0 782 069 A1    7/1997

OTHER PUBLICATIONS

K. Zeng et al., "Pseudorandom Bit Generators in Stream-Cipher Cryptography," Computer, vol. 24, No. 2, pp. 8-17 (Feb. 1, 1991).

(Continued)

*Primary Examiner* — Lewis A Bullock, Jr.
*Assistant Examiner* — Michael D Yaary
(74) *Attorney, Agent, or Firm* — Finnegan, Henderson, Farabow, Garrett & Dunner, L.L.P.

(57) ABSTRACT

A random binary sequence generator for generating a random binary sequence adapted to be used for producing random numbers, includes at least one logic circuit corresponding to an associated finite-state machine having a state-transition function including states arranged to form cycles of states, wherein the at least one logic circuit has a set of logic circuit inputs and a set of logic circuit outputs fed back to the logic circuit inputs; the associated finite-state machine is autonomous and asynchronous; the state-transition function is void of loops; and any of the cycles of states has either a minimum length equal to three states, in case the cycle is stable, or a minimum length of two states, in case the cycle is metastable.

29 Claims, 3 Drawing Sheets

U.S. PATENT DOCUMENTS

| | | | |
|---|---|---|---|
| 2002/0186086 A1 | 12/2002 | Curiger et al. | |
| 2003/0014452 A1 | 1/2003 | Le Quere | |
| 2003/0059045 A1 | 3/2003 | Ruehle | |
| 2004/0205095 A1* | 10/2004 | Gressel et al. | 708/253 |
| 2007/0244950 A1 | 10/2007 | Golic | |

OTHER PUBLICATIONS

B. Barak et al., "True Random Number Generators Secure in a Changing Environment," Cryptographic Hardware and Embedded Systems—CHES 2003, Lecture Notes in Computer Science, vol. 2779, pp. 166-180 (2003).

T. E. Tkacik, "A Hardware Random Number Generator", Cryptographic Hardware and Embedded System—CHES 2002, Lecture Notes in Computer Science, vol. 2523, pp. 450-453, (2003).

M. Dichtl, "How to Predict the Output of a Hardware Random Number Generator", Cryptographic Hardware and Embedded System—CHES 2003, Lecture Notes in Computer Science, vol. 2779, pp. 181-188, (2003).

Wang et al.; "Complete Feedback Shift Register Design for Built-In Self-Test" International Conference on Computer Aided Design, (ICCAD), XP-000747185, Santa Clara, Washington, IEEE Comp. Soc. Press, US, pp. 56-59, (1986).

Wang et al.; Institute of Electrical and Electronics Engineers: "A Hybrid Design of Maximum-Length Sequence Generators", Proceedings of the Annual Expert Systems in Government Conference, Washington, Washington, IEEE Comp. Soc. Press, US, Conf. 3, pp. 38-47, (1986).

"Debruijn Sequences From Cellular Automata" IBM Technical Disclosure Bulletin, IBM Corp. New York, US, vol. 33, No. 10A, pp. 410-413, (1991).

Zeng et al.; "Pseudorandom Bit Generators in Stream-Cipher Cryptography", Computer, vol. 8153, No. 2, pp. 8-17, (1991).

Barak et al.; "True Random Number Generators Secure in a Changing Environment", Cryptographic Hardware and Embedded System—CHES 2003, Lecture Notes in Computer Science, vol. 2779, pp. 166-180, (2003).

* cited by examiner

RANDOM NUMBER GENERATION BASED ON LOGIC CIRCUITS WITH FEEDBACK

CROSS REFERENCE TO RELATED APPLICATION

This application is a national phase application based on PCT/EP2004/051746, filed Aug. 9, 2004, the content of which is incorporated herein by reference.

BACKGROUND OF THE INVENTION

1. Field of the Invention

The present invention generally relates to methods and devices for generating random and/or pseudo-random numbers.

2. Background of the Invention

In many applications in the field of computers and other electronic devices there is a need for a physical source of true random numbers. Such applications include computer simulations of various probabilistic algorithms and processes, such as Monte Carlo numerical analysis, computer games, and cryptographic algorithms and protocols whose security relies on the ability to generate unpredictable secret keys. High-speed truly random sequences are also needed for setting up countermeasures against so-called side-channel attacks against specific electronic devices, particularly microelectronic devices, implementing security schemes, such as integrated chip cards; such countermeasures include for example random masking of cryptographic functions, as well as generation of secret keys for the encryption of internal links and memories in such devices.

The output of a Random Number Generator (RNG) is typically a binary sequence that, in principle, has to be unpredictable in the sense of the information theory. Equivalently stated, the RNG output should be statistically modeled as a purely random sequence, i.e., a sequence of mutually independent, uniformly distributed binary random variables (bits), with maximal possible entropy per bit. In particular, it should be computationally infeasible to distinguish the RNG output sequence from a purely random sequence or, equivalently, it should be computationally infeasible to predict the RNG output sequence.

As known in the art, random number sequences can be generated either by software or by hardware. Hardware-based RNGs are inherently capable of generating randomness of higher quality and speed, and those adapted to be implemented in the solid-state, semiconductor technology are preferable, because they can be more easily incorporated in Integrated Circuits (ICs), particularly digital ICs.

Hardware-based RNGs are known in the art that include analog electric/electronic elements, such as, for example, resistors and/or PN-junctions, and exploit as a source of randomness thermal noise and/or shot noise in such analog elements.

The presence of analog elements makes this type of RNGs difficult to be incorporated in digital ICs. Additionally, these RNGs are very sensitive to changes in temperature and other operating environment conditions, and this makes them vulnerable to physical attacks. Furthermore, the output sequence of these RNGs can be relatively slow. Consequently, in many practical electronic devices, including personal computers and integrated chip (IC) cards, analog hardware-based RNGs have not proven to be cost effective.

Another type of RNGs includes analog elements easier to be incorporated in digital ICs. For example, in U.S. Pat. No. 4,855,690 an integrated circuit RNG is disclosed, consisting of an analog oscillator exploited for varying the frequency of a higher-frequency Voltage-Controlled Oscillator (VCO). In particular, the analog oscillator is a free-running oscillator with triangular output signal that is used to control the VCO, which includes a nine-stage ring oscillator. To produce random digital values, the VCO output is sampled at a rate much smaller than the oscillation rate of the VCO, by means of a clock signal clocking a D-type flip-flop.

Several proposals have been made in the art for hardware-based RNGs that can be implemented by digital integrated circuits only, i.e., without using analog elements. These RNGs are typically based on free-running oscillators, implemented as ring oscillators, and exploit the phase jitter. As known in the art a ring oscillator is a circuit consisting of an odd number of (logic) inverters, connected in a circular cascade so as to form a ring. The ring connection and the odd number of inverters cause the circuit to oscillate; the number of inverters used in the ring determines the oscillation frequency, i.e., the frequency of the resulting signal. Accordingly, a ring oscillator can be equivalently represented by a circuit consisting of only one inverter, with appropriate delay.

For example, U.S. Pat. No. 4,641,102 describes an RNG in which a fast signal produced by a free-running oscillator is sampled by a slower clock through a D-type flip-flop and then XOR-ed into a number of shift registers circularly connected together and clocked by the same clock, where the XOR operation stands for the exclusive OR operation of binary values.

In another solution, described for example in U.S. Pat. No. 4,799,259, the outputs (binary oscillating signals) of a plurality of ring oscillators are combined with each other, using an XOR operation, and the combined output resulting from such combination is then sampled at a speed much lower than the oscillation frequency of the oscillators, by means of a system clock, through a D-type flip-flop; a so-called raw random binary sequence is thus obtained, having a certain degree of randomness due to the digital jitter, that is, due to unpredictable variations of frequency and relative phase shifts of the outputs of the different ring oscillators.

In particular, U.S. Pat. No. 4,799,259 discloses a random digital signal generator composed of an array of oscillator signal generators, particularly ring oscillators, each one operating at a different frequency; the outputs of the oscillators are XOR-ed together and then sampled at a much (at least 10-20 times) lower speed by a system clock through a D-type flip-flop.

The Applicant has observed that an important limitation of this type of RNGs is the considerable reduction in speed that is required in order to render them effective as a source of randomness. Moreover, the ring oscillators exhibit a tendency to lock onto each other and also on the system clock, which reduces the degree of randomness of the output sequence produced.

Another solution, described for example in U.S. Pat. No. 4,905,176, is to combine ring oscillators and Linear Feedback Shift Registers (LFSRs). LFSRs are commonly used as components of Pseudo-Random Number Generators (PRNGs). An LFSR is a cascade of D-type flip-flops, wherein the first flip-flop receives at its input a feedback signal corresponding to the output of the last flip-flop, possibly XOR-ed with the outputs of one or more other flip-flops in the cascade.

It is known in the art that binary sequences with a long period and good statistical properties can be produced by an LFSR operated in a synchronous manner according to a clock signal, and having appropriate feedback connections from the outputs of the intermediate flip-flops to the input of the first p-flop in the cascade. Nevertheless, an LFSR is however deterministic in nature and thus the output thereof is totally predictable; for this reason, the output sequences generated by LFSRs are qualified as pseudo-random, because they are not truly random, merely approximating some of the properties of true random numbers. The combination of LFSRs with ring oscillators introduces the necessary degree of randomness, allowing the circuit output to be non-deterministic; in other words, in such combinations of ring oscillators and LFSRs randomness is combined with pseudo-randomness.

In particular, ring oscillator signals can be used to clock the LFSRs; the output signal produced by the LFSRs then needs to be sampled at a lower speed by the system clock.

For example, U.S. Pat. No. 4,905,176 describes an embodiment of an RNG, wherein a free-running ring oscillator is used to drive/clock an LFSR, which is sampled at a lower speed by an external clock through a D-type flip-flop, thereby introducing randomly occurring deviations from the pseudo-random number sequence.

U.S. Pat. No. 4,905,176 also proposes a second embodiment of an RNG, wherein the output of a free-running oscillator is sampled at a lower speed by an external clock through a D-type flip-flop, the free-running oscillator being essentially a single LFSR, composed of a small number of delay elements, with a feedback signal produced by XOR gates, and which is operated asynchronously, without a clock signal. A delay element is implemented as a cascade of an even number of logic inverters. The oscillator would produce a pseudo-random output signal if operated synchronously from a non-zero initial state, but in the asynchronous operation it is expected to show elements of randomness due to unpredictable variations in the delay of delay elements.

The Applicant observes that the circuit is significantly flawed, because the state of all zeros is a fixed point in the state-transition diagram, which means that if the oscillator reaches such a state, which is very likely, it gets stuck in it and does not oscillate any more.

Still another example of an RNG involving a combination of ring oscillators that clock LFSRs is provided in the article by T. E. Tkacik "A Hardware Random Number Generator", Cryptographic Hardware and Embedded Systems—CHES 2002, Lecture Notes in Computer Science, vol. 2523, pp. 450-453, 2002. A 32-bit hardware RNG is described consisting of two independent ring oscillators, respectively clocking an LFSR, of length 43, and a CASR (Cellular Automata Shift Register—a variation of an LFSR being a programmable linear cellular automaton), of length 37. The 32-bit output is obtained by bitwise XOR-ing two 32-bit blocks taken from the LFSR and from the CASR; the output is sampled only when a new number is required. The minimal sampling period should allow each of them to be clocked a number of times that is at least twice as large as its length, before producing the next output block.

However, a subsequent article by M. Dichtl, "How to predict the output of a hardware random number generator," Cryptographic Hardware and Embedded System—CHES 2003, Lecture Notes in Computer Science, vol. 2779, pp. 181-188, 2003, proposes a practical attack on this RNG which allows predicting its output sequence. The attack is based on the fact that the two post-processing circuits are both linear, and that the only uncertainty to be guessed is the difference in the numbers of clocks for each of the circuits in a relatively short period of time. The attack can be prevented by reducing the output data rate by taking much less than 32 bits at a time or by increasing the minimal sampling period.

In an alternative solution, proposed for example in U.S. Pat. No. 6,240,432, ring oscillator output signals are XOR-ed with data inputs to particular flip-flops in LFSRs, clocked by a system clock slower than the ring oscillator frequencies. In this way, additional randomness is possibly introduced by effectively sampling multiple ring oscillator signals at various points in the LFSR circuit.

In particular, U.S. Pat. No. 6,240,432 discloses a RNG wherein an LFSR with additional XOR gates and a plurality of free-running (ring) oscillators are used to enhance randomness of the digital signals created at the outputs of the ring oscillators. In addition to the XOR gates used in the feedback path of the LFSR, additional XOR gates are also interposed between stages of the LFSR, and each of these additional XOR gates is connected to a high-frequency oscillator, so as to randomize the digital signals flowing between the LFSR stages. The frequencies of the oscillators are set so as not to be duplicated, and not to be a actor or multiple of one another; additionally, the oscillator frequencies are higher than the fluency of the system clock used to step the LFSR.

Another example of a digital RNG making use of a combination of ring oscillators and an LFSR is provided in US 2002/0156819: the RNG consists of an LFSR, a system clock driving the LFSR, and a plurality of free running oscillators connected to the input of the LFSR. In order to avoid interlocking of the oscillators and the system clock, the oscillators and the system clock have different oscillation frequency values, the greatest common divisor of which having the value one. The oscillator outputs are XOR-ed together, then sampled through a D-type flip-flop by the (slower) system clock, and then further XOR-ed into the data input of the LFSR clocked by the same system clock.

The Applicant has observed that another possible source of true randomness in digital semiconductor circuits is the meta-stability of RS (Reset-Set) latches and edge-triggered flip-flops based on RS latches. Namely, the output of such a flip-flop may become unpredictable if the input and clock signals are such that the characteristic setup and/or hold times are violated. For example, this may happen in a D-type flip-flop if the data input signal is forced to change at nearly the same time as the clock signal. The output signal then stabilizes on a random, typically biased value after a random amount of time (the bias being due to factors inherent to the physical implementation of the devices). The meta-stability of D-type flip-flops can possibly be exploited together with the jitter of ring oscillator signals by using D-type flip-flops for sampling the ring oscillator signals.

For example, U.S. Pat. No. 5,570,307 describes a digital RNG consisting of a plurality of free-running (ring) oscillators each of which is sampled by a common, much slower external clock through a separate D-type flip-flop and with their outputs XOR-ed together to form two output signals. These output signals are then XOR-ed into a circuit consisting of two shift registers with cross-feedback formed by applying XOR gates to individual stages of the registers, and this circuit is clocked by the same external clock. To improve on the randomness, some delay elements are inserted into the registers to possibly force the constituent D-type flip-flops into meta-stability, by intentionally violating the flip-flop setup or hold time margins of incoming data relative to the jitter clock. Also, the external clock itself is produced with jitter.

Meta-stable behavior of flip-flops is also exploited in an RNG disclosed in U.S. Pat. No. 6,631,390, which describes several ways of exploiting the meta-stability of D-type flip-flops in order to obtain digital RNGs. They include detecting the meta-stability event and then using the corresponding output signal values or the timings between successive meta-stability events. The output of the flip-flop is compared to an input waveform to determine if the output signal does not match the input signal, indicating a meta-stable state. When a meta-stable state is detected, an output bit is provided as a random bit.

SUMMARY OF THE INVENTION

It is the Applicant's opinion that in spite of the relatively high number of solutions proposed in the art of hardware-based RNGs, a need reins for a new method and related circuit for high-speed generation of true random numbers that can be implemented by using only logic gates in digital semiconductor technology.

Concerning the solutions known in the art, the Applicant observes that an important limitation of the class of RNGs based on digital ring oscillators, possibly combined with LFSRs, is the considerable reduction in speed that is required in order to render them effective as a source of randomness, since the variance of the underlying digital jitter is relatively small. Moreover, the ring oscillators exhibit a tendency to lock onto each other and also on the system clock, which reduces the degree of randomness of the output sequence produced.

Another observation of the Applicant is that due to the fact that an LFSR is a linear circuit, whose output is easily predictable by solving linear equations, it is unlikely that the desired or requested computational unpredictability of the RNG output sequence can be effectively improved solely by using LFSRs and regular sampling.

Regarding the solutions relying on meta-stability, the Applicant points out that the meta-stability events are relatively rare and very sensitive to temperature and voltage changes, so that RNGs solely based on meta-stability are relatively slow and do not appear to be very reliable.

Therefore, according to the Applicant, there is a need for a new random number generation method, and related circuit, that is efficient in terms of the logic gate count, the achievable speed, and the power consumption; in particular, it would be desirable to have a random number generation circuit that is suitable for integration in both FPGA (Field Programmable Gate Array) and ASIC (Application Specific Integrated Circuit) digital IC technologies.

The Applicant has found a new method and apparatus for generating high-speed and high-entropy random binary sequences by using only logic gates in digital semiconductor technology. According to the present invention, the random binary sequence is produced by using a digital, logic (i.e., combinatorial) circuit that implements Boolean functions (one for each state bit) corresponding to the state-transition function of an autonomous Finite-State Machine (FSM) without fixed points, i.e., without loops in the respective state-transition diagram, and which is operated without a clock, in an asynchronous manner, by feeding back the logic circuit outputs, that represent the next state, to the respective logic circuit inputs, representing the current state. The FSM is thus asynchronous, and it will be henceforth referred as the asynchronous FSM; however, solely for the purpose of simplifying the analysis thereof the asynchronous FSM will sometimes be assumed to operate synchronously, i.e., as if its operation were synchronized by a timing signal.

For each next-state bit, the logic circuit thus implements one Boolean function; in order to avoid feedback loops not involving any logic gate, the binary identity function, in this asynchronous operation, is preferably implemented as a delay element, for example, as a cascade of an even number of inverters. The oscillating signal produced at the output of this asynchronous logic circuit with feedback is then sampled by a sampling signal, e.g., the system clock or a signal generated by another, independent ring oscillator, through a D-type flip-flop, to obtain the desired raw random binary sequence. Unlike the conventional RNGs based on ring oscillators, the sampling rate, instead of being much smaller than the frequency of the oscillating signal, may be similar to this frequency.

The requirement that the autonomous FSM has no fixed points is particularly important: if a fixed point existed in the state-transition function, then the asynchronous logic circuit with feedback might get stuck in the corresponding state, thus producing a constant output sequence, which, of course, cannot be used as a source of randomness. On the contrary, if there are no fixed points, such an undesirable situation cannot occur, so that it is guaranteed that the state sequence oscillates among a number of states. It is observed that the requirement of no fixed points in the state-transition function is, for example, not satisfied by an LFSR, since its state-transition function contains a fixed point, namely, the all-zero state.

The oscillating output signal, as well as the resulting raw random binary sequence have pseudo-randomness properties similar to those that they would have if the circuit were supposed to operate synchronously, as well as randomness properties due to unpredictable variations in the delay of internal logic gates, which get propagated and enhanced through feedback, to possible internal meta-stability events, and to frequent meta-stability events in the sampling D-type flip-flop. The meta-stability events in the sampling D-type flip-flop are frequent if the independent sampling clock signal, possibly produced by a ring oscillator, has a rate similar to the basic frequency of the oscillating output signal, which is reciprocal to the total logic delay in the shortest feedback loop of the underlying logic circuit with feedback, and if both signals have a relatively small delay-to-rise time ratio. In this case, it is likely that many transitions in the oscillating output signal cannot be completed to the digital, binary level, so that the oscillating output signal is likely to have unpredictable variations at the analog as well as digital level, which induce a frequent violation of the characteristic setup and/or hold times for the sampling D-type flip-flop. The underlying delay variations are mainly due to fluctuations in voltage and temperature, because of various internal and external noise factors.

The degree of pseudo-randomness of the raw random binary sequence depends on the particular state-transition function of the FSM. In particular, for the oscillating output signal to have a long period and good statistical properties, when the autonomous asynchronous FSM is assumed to operate synchronously, an additional requirement is that the corresponding state-transition diagram contains only relatively long cycles. Short cycles are also allowed, provided that they are meta-stable, which means that, in the asynchronous operation, it is practically impossible that the state sequence gets trapped in one of them by oscillating among the corresponding states. In the asynchronous operation of the autonomous FSM, the randomness properties are superimposed on the pseudo-randomness properties expected for the synchronous operation.

Practically important concretizations of the general FSM construction described above include two oscillator structures, both based on a cascade of inverters, but with feedback connections more complex than the simple circular feedback defining a ring oscillator, incorporating a number of XOR logic gates. The feedback connections are chosen according to a mathematical characterization (described hereinafter), so as to satisfy the basic condition that the corresponding state-transition function has no fixed points. For both structures, the feedback connections are in particular chosen in order to guarantee the presence of one long cycle and one short cycle of length 2, and this short cycle is meta-stable in the asynchronous operation.

The randomness of the output raw random binary sequence can further be increased by XOR-ing the outputs of two or more of such oscillator structures. This also increases robustness of the raw random binary sequence, i.e., the relative insensitivity of the entropy rate of the generated raw random binary sequence to various factors including implementation technology as well as random or intentional environmental changes.

The Applicant has observed that the mutual coupling or interlocking effect, typical of RNGs based on ring oscillators, is practically eliminated due to the pseudo-randomness of the oscillating output signal.

A purely random RNG output sequence can be obtained from the raw random binary sequence thus generated, by submitting it to a further digital post-processing so as to remove the residual bias and other redundancy. For example, this can be achieved by incorporating the raw random binary sequence into a synchronous FSM circuit implementing a relatively simple PRNG, with an appropriate reduction in speed to guarantee the maximal possible entropy per bit in the RNG output sequence.

According to an aspect of the present invention, there is provided a random binary sequence generator for generating a random binary sequence adapted to be used for producing random numbers.

The random binary sequence generator comprises a logic, combinatorial circuit with feedback corresponding to an associated Finite-State Machine (FSM) having a state-transition function including states arranged to form cycles of states.

The finite-state machine is autonomous, the logic circuit outputs, presenting the next state, being fed back to the respective logic circuit inputs, representing the current state, and has an asynchronous operation.

The state-transition function contains no loops, and any cycle of the state-transition function has either a minimum length equal to three constituent states, in case the cycle is stable, or a minimum length of two constituent states, in case the cycle is meta-stable.

A state-transition function containing no loops is one in which no states exist that, when reached, cannot be left anymore; in other words, the absence of loops means that no states exist in the state-transition function for which the next state coincides with the current state.

For the purposes of the present invention, a meta-stable cycle is meant to be a cycle for which, if that cycle is entered, it is highly probable that the FSM jumps from that cycle to some other state not belonging to the cycle. It is observed that meta-stability is possible thanks to the fact that the operation of the FSM is asynchronous.

The output function of the FSM, which produces an output when applied to an internal state at any time, should effectively depend on the parts of the internal state that cannot get stuck at a fixed value, as the condition of the absence of fixed points does not imply that there are no parts of the internal state that can get stuck at a fixed value. In other words, the inputs to the FSM output function need not be the whole set of internal state variables of the FSM, rather they may correspond to a subset of the FSM internal state variables; the choice of such a subset of the FSM internal state variables to be fed to the FSM output function should be such that, in operation, the values of the chosen variables ultimately vary in time, that is, they cannot get stuck at a fixed value, i.e., cannot become constant.

According to an aspect of the present invention, a random binary sequence generator for generating a random binary sequence adapted to be used for producing random numbers is provided, comprising:

at least one logic circuit corresponding to an associated finite-state machine having a state-transition function including states arranged to form cycles of states, wherein:

the at least one logic circuit has a set of logic circuit inputs and a set of logic circuit outputs fed back to said logic circuit inputs;

the associated finite-state machine is autonomous and asynchronous;

the state-transition function is void of loops; and any of said cycles of states has either a minimum length equal to three states, in case the cycle is stable, or a minimum length of two states, in case the cycle is meta-stable.

In particular, said finite-state machine associated with the at least one logic circuit has an output function, and the random binary sequence generator further comprises at least one output logic circuit operatively connected to at least one of said logic circuit outputs of the at least one logic circuit, the output logic circuit having an output for providing an output signal by implementing said output function. The at least one of said logic circuit outputs has a value that cannot get stuck at a constant value.

The random binary sequence generator may further comprise a sampling circuit for sampling said output signal.

In particular, the at least one logic circuit comprises a plurality of asynchronous logic inversion units connected in cascade one to another, respectively.

Said plurality of asynchronous logic inversion units may comprise a first and a last asynchronous logic inversion units in the cascade, said set of logic circuit outputs comprising an output of the last asynchronous logic inversion unit and said set of logic circuit inputs comprising an input of the first asynchronous logic inversion unit, said at least one logic circuit comprising a first feedback path from the output of the last asynchronous logic inversion unit to the input of the first asynchronous logic inversion unit.

Said plurality of asynchronous logic inversion units may further comprise at least one intermediate asynchronous logic inversion unit in the cascade, wherein said at least one logic circuit comprises at least one second feedback path from an output of a respective asynchronous inversion unit in the cascade the input of the first asynchronous logic inversion unit, and wherein said respective asynchronous logic inversion unit is chosen in the group consisting of the first asynchronous logic inversion unit and the at least one intermediate asynchronous logic inversion unit.

In an embodiment of the present invention, the at least one logic circuit further comprises an XOR logic combination of the first and the at least one second feedback paths.

In particular, said at least one second feedback path includes a plurality of second feedback paths.

The at least one logic circuit may have an associated binary polynomial f(x) defined as:

$$f(x) = \sum_{i=0}^{r} f_i x^i$$

wherein $x^i$ corresponds to the output of the $i^{th}$ asynchronous logic inversion unit in the cascade, $f_i$ is a feedback coefficient associated with the $i^{th}$ asynchronous logic inversion unit and indicative of the presence of the $i^{th}$ of said plurality of second feedback paths from said output of the $i^{th}$ inversion unit to the input of the first inversion unit, the summation being a binary addition, and the binary polynomial f(x) satisfying the conditions:

$$f(x)=(1+x)h(x)$$

and $$h(1)=1.$$

In another embodiment of the present invention, said plurality of asynchronous logic inversion units comprises at least one intermediate asynchronous logic inversion unit in the cascade, and said at least one logic circuit comprises at least one second feedback path from said output of the last asynchronous logic inversion unit to an input of a respective asynchronous logic inversion unit, said respective asynchronous logic inversion unit being chosen in the group consisting of the at least one intermediate asynchronous logic inversion unit and the last asynchronous logic inversion unit in the cascade.

In particular, the at least one logic circuit further comprises an XOR logic combination of said at least one second feedback path and the output of a preceding asynchronous logic inversion unit that precedes said respective asynchronous logic inversion unit where said at least one second feedback path terminates.

Said at least one second feedback path may include a plurality of feedback paths, and the logic circuit with feedback may have an associated binary polynomial g(x) defined as:

$$g(x) = \sum_{i=0}^{s} g_i x^i$$

wherein $x^i$ corresponds to the output of the $i^{th}$ asynchronous logic inversion unit in the cascade, $g_i$ is a feedback coefficient associated with the $i^{th}$ asynchronous logic inversion unit and indicative of the presence of the $i^{th}$ of said plurality of second feedback paths from said output of the last inversion unit to the input of the $i^{th}$ inversion unit, the summation being a binary addition, and the binary polynomial g(x) satisfying the conditions:

$$g(x)=(1+x)k(x)$$

with s being odd.

In an embodiment of the present invention, the binary polynomial g(x) satisfies the further condition:

$$k(1)=1.$$

Each of said asynchronous logic inversion units may comprises a given odd number of logic inverters.

In an embodiment of the present invention, the state-transition function is an affine transformation, affine with respect to the binary field.

In particular, the generic element of the at least one logic circuit is selected from the group consisting of binary complement elements, binary identity elements and binary addition elements.

The sampling circuit may operate according to a timing signal, and may comprise a D-type flip-flop.

The at least one logic circuit may comprise at least a first and a second logic circuits, having respective output logic circuits operatively connected thereto and implementing the output function of the finite-state machine associated with the respective logic circuit, the output logic circuits having each a respective output for providing an output signal by implementing said output function.

The random binary sequence generator may fiber comprise a combination of the output signals of the output logic circuits for producing a combined output signal.

According to another aspect of the present invention, a random number generator is provided comprising a random binary sequence generator generating a raw random binary sequence, and a post processing circuit adapted to be fed with the raw random binary sequence for processing it, so as to produce a purely random binary sequence, wherein the random binary sequence generator is realized according to the first aspect of the present invention.

According to still another aspect of the present invention, a method is provided, for generating a random binary sequence adapted to be used for producing random numbers, comprising:

providing at least one logic circuit having a set of logic circuit inputs and a set of logic circuit outputs, the at least one logic circuit corresponding to an associated finite-state machine having a state transition function including states arranged to form cycles of states, wherein the state-transition function is void of loops, and any cycle of the state-transition function has either a minimum length equal to three states, in case the cycle is stable, or a minimum length of two states, in case the cycle is meta-stable;

feeding back the set of logic circuit outputs to said logic circuit inputs; and operating the logic circuit autonomously and asynchronously.

The method may further comprise generating an output signal from said set of logic circuit outputs and sampling said output signal.

Said sampling may comprise providing a timing signal, feeding the output signal to a sequential circuit element, and using the timing signal to clock the sequential circuit element.

Said generating an output signal may comprise providing at least a first and a second logic circuits having respective output signals, and obtaining said output signal by combining the respective output signals.

BRIEF DESCRIPTION OF THE DRAWINGS

The features and advantages of the present invention will be made apparent by the following detailed description of some preferred embodiments thereof, provided merely by way of non-limitative examples, description that will be conducted making reference to the attached drawing, wherein.

DETAILED DESCRIPTION OF THE PREFERRED INVENTION EMBODIMENTS

Figure 1:
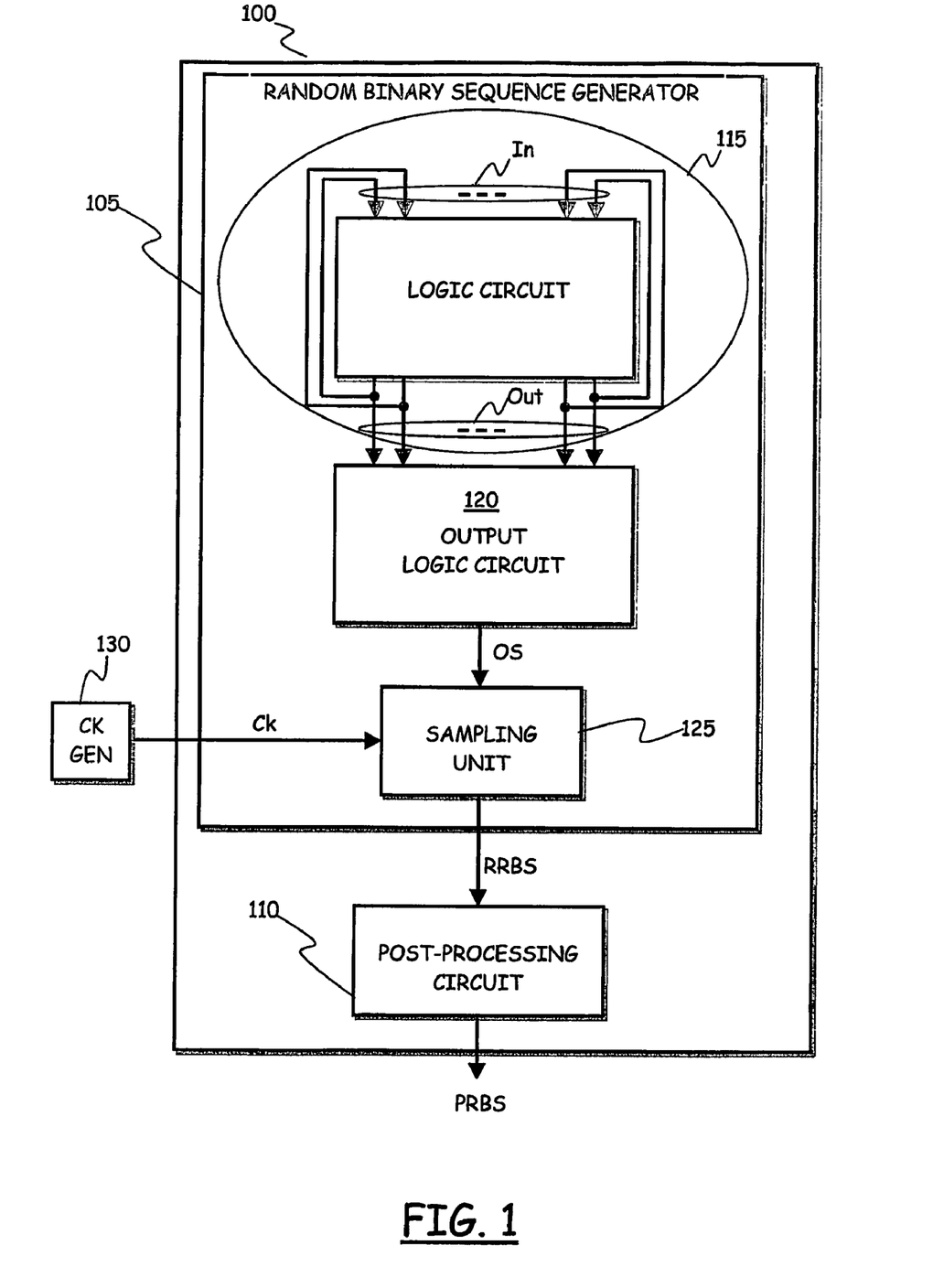
FIG. 1 schematically shows, in terms of the relevant functional blocks, the general structure of an RNG including a random binary sequence generator according to an embodiment of the present invention.

Referring to the drawings, in FIG. 1, the general structure of a Random Number Generator (RNG) according to an embodiment of the present invention is schematically shown, in terms of the relevant functional blocks. The RNG, globally identified by 100, includes a random binary sequence generator 105, generating a raw random binary sequence RRBS that is supplied to a post-processing circuit 110 for generating a purely random binary sequence PRBS.

According to an embodiment of the present invention, the random binary sequence generator 105 includes a logic (i.e., combinatorial) circuit with feedback 115, having a set of logic circuit inputs, for receiving input signals In to the logic circuit, and a set of logic circuit outputs, for providing output signals Out, which are fed back to the logic circuit inputs. The logic circuit with feedback 115 corresponds to an associated Finite-State Machine (FSM) having a state-transition function. In particular, the logic circuit with feedback 115 implements the state-transition function of an autonomous FSM, i.e., an FSM that receives no eternal inputs: all the inputs of the logic circuit 115 receive in feedback input signals, whose values represent the current state of the FSM respective output signals of the logic circuit 115, whose values represent the next state of the FSM.

The logic circuit with feedback 115 is asynchronous, i.e., it is operated without a timing or clock signal, and it evolves through the succession of states in a manner that is not synchronous with a specific timing signal but rather according to the delays of the constituent logic gates.

In particular, the state-transition function implemented by the logic circuit with feedback 115 is, in the mathematical sense, an affine transformation with respect to the binary field. As is generally known, an affine transformation or affine map between two vector spaces consists of a linear transformation followed by a translation. In the binary case, a linear transformation is composed of binary linear functions, where a binary linear function is a binary (XOR) sum of a subset of input variables, whereas an affine transformation is a linear transformation whose output variables are allowed to be complemented. Note that a binary complement of a binary variable is equal to the binary sum of this variable and the constant 1.

The logic circuit with feedback 115 is then composed of combinatorial logic elements; preferably, the generic combinatorial logic element of the logic circuit with feedback 115 is either a binary complement element (e.g., an inverter), or a binary identity element, or a binary addition element (e.g., an XOR logic gate).

In particular, to avoid feedback loops not involving any logic gate, the binary identity element is implemented by delay units, for example, composed of an even number of logic inverters.

The values of the logic circuit output signals Out vary following the evolution of the logic circuit with feedback 115 through the corresponding sequence of states. The output signals Out are fed to an output logic circuit 120, that implements an output logic function to be applied to the output signals Out of the logic circuit with feedback 115, so as to produce an oscillating output signal OS. The logic circuit with feedback 115 and the output logic circuit 120 implement together an autonomous FSM operated asynchronously.

The oscillating output signal OS is fed to a sampling unit 125, operated by a timing or clock signal Ck independently and autonomously generated by a clock signal generator 130; the sampling unit 125 is adapted to sample the oscillating output signal OS at a rate determined by the frequency of the clock signal Ck. The sampling unit 125 may for example comprise a D-type flip-flop, receiving at a data input thereof the oscillating output signal OS and being clocked by the clock signal Ck. The clock signal Ck may, for example, be the system clock of an Integrated Circuit (IC—not shown in the drawing) in which the RNG 100 is incorporated, for example, an IC for a smart card; alternatively, the clock signal Ck may be generated by means of an independent, free-running ring oscillator.

At the output of the sampling unit 125, the raw random binary sequence RRBS is obtained; by raw random binary sequence there is meant a random binary sequence that may be not purely random, that is, a binary sequence in which the generated bits may be biased and mutually correlated, to a certain degree. The raw random binary sequence RRBS is then fed to the post-processing circuit 110 in order to generate the purely random binary sequence PRBS, composed of mutually independent and uniformly distributed bits, which can further be used to produce random numbers according to a particular application.

In particular, according to an embodiment of the present invention, the logic circuit with feedback 115 is such that no fixed points exist in its state-transition function. As known in the art, a state-transition function can be represented by a state-transition diagram in which each state is connected by a directed branch to its corresponding next state, which is uniquely determined by the state-transition function. Adopting such a representation, the condition of the absence of fixed points in the state-transition function translates into the absence of loops in the state-transition diagram, wherein by loop there is intended a single state together with a single directed branch leaving from and re-entering into that state. If a fixed point exists in the state-transition function, the logic circuit with feedback 115 may, and in fact is likely to, get stuck in the corresponding state, in which case the output signals Out would no more oscillate, having instead a constant value, thus producing a constant raw binary sequence. The condition of the absence of fixed points guarantees instead that the logic circuit with feedback 115 never gets stuck in a fixed state and thus oscillates among a number of states, so that the produced raw binary sequence does not have a constant value.

It is observed that the above-mentioned condition of the absence of fixed points in the state-transition function reflects on the internal structure of the logic circuit with feedback 115: for example, a logic circuit with feedback 115 having a structure similar to that of an LFSR, but operated asynchronously, with delay elements instead of synchronous D-type flip-flops, is not suitable, because the corresponding state-transition function has a fixed point, being a state composed of all zeros.

Also, still in order to avoid that the output signal OS remains constant, the output logic circuit 120 should be such that the output function it implements effectively depends on the parts of the internal state (i.e., on subsets of the output signals Out) that do not get stuck at a fixed value, as the condition of the absence of fixed points does not imply that there are no parts of the internal state that can get stuck at a fixed value.

The described arrangement allows obtaining an output signal OS that is guaranteed to oscillate, and that not only exhibits digital pseudo-randomness properties similar to those of the output sequence of the same FSM when assumed to be operated synchronously, clocked by a clock signal, but, thanks to the asynchronicity, the output signal OS also exhibits randomness properties, due to unpredictable variations in the delay of logic gates in the logic circuit with feedback 115, delay variations being further propagated and enhanced through feedback and, possibly, also to internal meta-stability events due to feedback as well. For example, delay variations may derive from fluctuations in operating voltage and temperature, because of various internal and external noise factors.

Advantageously, in addition to the pseudo-randomness and randomness properties of the output signal OS, additional randomness is introduced in the raw random binary sequence RRBS thank to meta-stability that is induced within the sampling unit 125. For example, such meta-stability events are frequent if the following two conditions are met.

Firstly, the delay-to-rise time ratio of the oscillating output signal OS should be relatively small, which means that the delays of the internal logic gates of the logic circuit with feedback 115 are relatively short, which further means that the basic oscillating frequency of the output signal OS is relatively high. The basic oscillating frequency is reciprocal to the total logic delay in the shortest feedback loop present in the logic circuit with feedback 115. If such a condition is met it is likely that many transitions in the oscillating output signal OS cannot be completed to the digital, binary level, so that this signal is likely to exhibit unpredictable variations on the analog as well as digital level; in other words, the oscillating output signal OS is not just a sequence of pure (full value) high and low voltage values corresponding to the digital values of 1 and 0, but rather it is more like a sort of analog noise.

Secondly, unlike the known solutions exploiting ring oscillators, the sampling rate of the oscillating output signal OS, corresponding to the frequency of the autonomously and independently generated sampling clock signal Ck, instead of being much smaller than the basic oscillating frequency of the oscillating output signal OS to be sampled, is preferably similar to this frequency. Therefore, if the output signal OS has a relatively small delay-to-rise time ratio, then so does the clock signal Ck.

As a consequence of the two conditions defined above, the characteristic setup and/or hold times for the sampling D-type flip-flop are frequently violated. This in turn introduces additional randomness into the raw random binary sequence, due to frequent mete-stability events occurring in the sampling D-type flip-flop, maintaining the high speed of the oscillating output signal OS. As a result, a high-speed raw random binary sequence RRBS that contains a high amount of entropy per bit is thus obtained at the output of the sampling unit 125. In other words, the entropy rate (i.e., the amount of entropy per second) of the raw random binary sequence RRBS is high, as desired.

The raw random binary sequence is preferably further processed, so as to remove the residual bias and other redundancy such as mutual correlation between the bits, and thus to obtain a purely random binary sequence at a somewhat reduced rate. Thus, the RRBS is fed to the post-processing circuit 110, for producing the purely random binary sequence PRBS. For example, the post-processing circuit may be based on a Pseudo-Random Number Generator (PRNG) adapted for this purpose.

The degree of pseudo-randomness existing in the raw random binary sequence RRBS depends on the particular state-transition function of the FSM implemented by the logic circuit with feedback 115. In particular, for obtaining an oscillating output signal OS having a long period and good statistical properties, in synchronous operation, an additional requirement or the FSM is that the corresponding state-transition diagram contains only relatively long cycles. However, it is observed that also short cycles may be allowed, even cycles of length 2, composed of only 2 states, provided that such short cycles are meta-stable in the asynchronous operation, which means that it is practically impossible that the state sequence gets stuck in one of them by oscillating among the corresponding state. By way of comparison, a conventional ring oscillator, irrespective of the number of cascaded inverters, can always be equivalently reduced to a logic circuit with feedback containing only one logic inverter with an appropriate delay, so that the underlying state-transition diagram then has only one cycle of length 2, which is stable.

The good pseudo-randomness properties expected for the synchronous operation are translated into the corresponding pseudo-randomness properties corresponding to the asynchronous operation of the FSM, which, together with the introduced randomness properties described above, provide an increased degree of robustness, i.e., insensitivity to changes in the statistics of the underlying random variations in the delay of internal logic gates, in comparison with conventional ring oscillators.

Hereinafter, three possible practical implementations of the random binary sequence generator 105 will be presented, being intended that the three implementations that will be discussed are to be intended as merely exemplary, not at all limitative, and that other implementations are possible.

Figure 2:
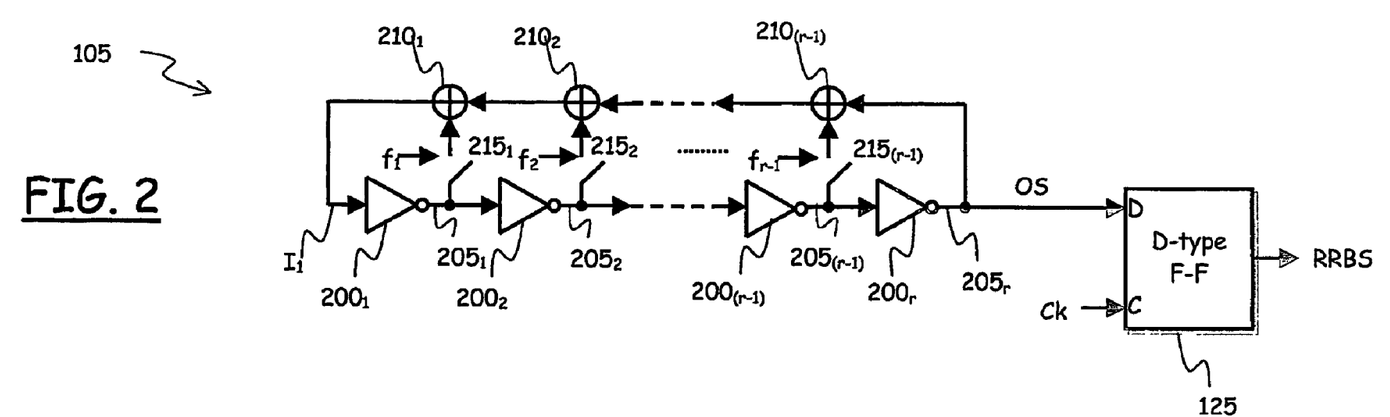
FIG. 2 shows a first possible implementation of the random binary sequence generator, in an embodiment of the present invention.

Referring firstly to FIG. 2, a plurality of, e.g., r, logic inversion units $200_1, 200_2, \ldots, 200_{(r-1)}, 200_r$ are connected in cascade one to another. Except for the last inversion unit $200_r$ in the cascade, the output of each inversion unit $200_1, 200_2, \ldots, 200_{(r-1)}$ is directly used as the input to the next inversion unit.

A plurality of feedback paths from the outputs of the inversion units to the input of the first inversion unit $200_1$ in the cascade are provided. In particular, the output signal $205_r$ of the last inversion unit $200_r$ in the inversion units cascade, said output signal $205_r$ corresponding to the oscillating output signal OS of the random binary sequence generator 105, is fed back as an input signal $I_1$ to the first inversion unit $200_1$ of the inversion unit cascade; along the feedback path, said output signal $205_r$ is combined, particularly according to XOR (eXclusive OR) operations (performed, for example, by two-input XOR gates $210_1, 210_2, \ldots, 210_{(r-1)}$), with one or more of the output signals $205_1, 205_2, \ldots, 205_{(r-1)}$; which ones of the output signals $205_1, 205_2, \ldots, 205_{(r-1)}$ are combined in XOR operation with the output signal $205_r$ to obtain the input signal $I_1$ to the first inversion unit $200_1$ is determined by the open/closed state of one or more of a plurality of switches $215_1, 215_2, \ldots, 215_{(r-1)}$; said open/closed state is specified by the assertion/deassertion of open/closed state control signals $f_1, f_2, \ldots, f_{r-1}$: when the generic control signal $f_i$ (i=1, 2, . . . , r−1) is deasserted at a logic "0", the corresponding switch $215_i$ is open and the output signal $205_i$ is not XOR-ed with the output signal $205r$ of the last inversion unit $200_r$; on the contrary, when the control signal $f_i$ is asserted at a logic "1", the corresponding switch $215_i$ is closed and the output signal $205_i$ is XOR-ed with the output signal $205_r$ of the last inversion unit $200_1$. In other words, the open/closed state of the switches $215_1, 215_2, \ldots, 215_{(r-1)}$, as specified by the logic state of the open/closed state control signals $f_1, f_2, \ldots, f_{r-1}$, determines the feedback paths from the outputs of the inversion units to the input of the first inversion unit of the cascade.

In a practical implementation, the generic inversion unit $200_i$ is, for example, formed by an elementary inverter, e.g., a CMOS inverter, or, alternatively, by an odd number of elementary inverters in a series; this latter construction may be in some circumstances preferable, because in this way the designer may individually adjust the transmission delay of the single inversion unit in the cascade. However, it is pointed out that the specific construction of the inversion units is not limitative to the present invention: in general, any logic circuit acting as a logic inverting delay unit can be exploited.

It is observed that, in practice, it is not necessary to materially implement (r−1) selectively activatable feedback paths, the activation of which is individually determined by the open/closed state of the respective switch: the open/closed state control signals $f_1, f_2, \ldots, f_{r-1}$ may in fact be regarded as binary-valued coefficients, each coefficient specifying, depending on the respective value, if the associated feedback path is materially provided or not. In other words, the output of the last inversion unit $200_r$, together with the outputs of the preceding inverters as specified by the coefficients $f_i$ being equal to "1" are XOR-ed together to form the feedback signal defining the input $I_1$ to the first inverter $200_i$ in the cascade; the outputs of those inversion units in the cascade corresponding to the coefficients $f_i$ equal to "0" are instead not used to form the feedback signal.

However, if all the possible feedback paths are provided for, selectively activatable by controlling the respective switches, the circuit results to be configurable, and greater flexibility is ensured.

It is also observed that although in the exemplary implementation herein described and shown the output signal OS coincides with the output signal of the last inversion unit $200_r$, in the cascade, this is not at all limitative: the output signal OS might in fact also be tapped off the output of any other inverter in the cascade.

The circuit of FIG. 2 resembles an LFSR in the so called Fibonacci configuration (a so-called Fibonacci LFSR); however, differently from the Fibonacci LFSR, the circuit of FIG. 2 has asynchronous inverting delay units instead of synchronous delay units implemented as synchronously clocked D-type flips-flops. Importantly, the logic inversions operated by the inverting delay units make the circuit of FIG. 2 work in a mathematically different way form the Fibonacci LFSR, even if it is assumed to be operated synchronously.

The feedback paths from the outputs of the inversion units in the cascade to the input of the first inversion unit are preferably chosen in order to satisfy the above-mentioned requirement that no fixed points exist in the corresponding state-transition function.

For a mathematical analysis, it is convenient to represent the feedback coefficients by means of a binary polynomial f(x):

$$f(x) = \sum_{i=0}^{r} f_i x^i$$

wherein $x^i$ corresponds to the generic output $205_i$, with $i=0$ to r, the summation is binary (i.e., it is a modulo-2 addition, i.e., an XOR operation), and $f_0 = f_r = 1$.

Analysis of the state-transition function corresponding to the logic circuit with feedback shown in FIG. 2 is conducted by assuming that the circuit is operated in a synchronous manner, i.e., that the logic inversion units $200_1, 200_2, \ldots, 200_r$ operate on the basis of a timing signal, which (e.g. in simulations) can be implemented by introducing a synchronously clocked D-type flip-flop after each logic inversion unit in the cascade.

A mathematical analysis reveals that the circuit of FIG. 2 has no fixed points in the respective state-transition function if and only if the following conditions (in the following simply referred to as "condition $C_F$") are satisfied:

$f(x) = (1+x)h(x)$ and $h(1) = 1$.

The above condition $C_F$ equivalently means that the polynomial f(x) is divisible by (1+x), i.e., that f(1)=0, and that the quotient polynomial h(x) is not divisible by (1+x). It is emphasized that from the above condition $C_F$ there follows that the degree r of the polynomial f(x) can be odd or even, but necessarily $r \neq 2$.

Further mathematical analysis shows that, provided that the above condition $C_F$ is satisfied, the state-transition diagram of the circuit of FIG. 2, assumed to be operated in a synchronous manner, contains one short cycle, particularly a cycle of length 2, composed of the two states of "all-zeros" and "all-ones", and a plurality of longer cycles, whose number and lengths depend on the polynomial h(x), in a way known in the theory of linear recurring sequences.

It thus follows that the said short cycle of length 2 is meta-stable in the asynchronous operation, because in practice the transition between these two states is extremely unlikely to happen, since when the outputs of all the inversion units quasi-simultaneously reach the intermediate voltage value, half-way between the voltage values corresponding to binary logic states of "1" and "0", the further transition in the same direction is not sustained any more and hence becomes unpredictable. As a consequence, if by chance the state sequence ever enters this cycle, then it can spend only a very short time in it.

Preferably, the polynomial h(x) is chosen in such a way so as to be a primitive polynomial (i.e., an irreducible polynomial with maximal period equal to $2^{r-1}-1$ as in this case, according to the theory of linear recurring sequences, there is only one long cycle, of length $2^r-2$. This ensures good pseudo-randomness properties of the oscillating output signal OS, including a long period and good statistical properties.

In addition to having good pseudo-randomness properties, the oscillating output signal OS also exhibits randomness properties, as discussed in connection with the more general structure of logic circuit with feedback 115 of FIG. 1, all the consideration made for that general structure being directly applicable to the specific logic circuit of FIG. 2. In particular, randomness properties derive from the unpredictable variations in the delay of the inverter logic gates, which get propagated and enhanced through feedback, the possible internal meta-stability events, and the frequent meta-stability events in the sampling D-type flip-flop.

For the logic circuit of FIG. 2, the frequency of the oscillating output signal OS is determined by the total delay of the logic inversion units in the shortest feedback loop, that is, in the loop identified by the smallest index i such that $f_i=1$. Thus, in order to obtain a high-speed oscillating output signal OS, it is preferable that such an index i is small, e.g., equal to 1 or 2 and that the delay introduced by the individual inverting units is small (in practice, this means that the (odd) number of elementary inverter logic gates forming the logic inversion units is relatively small).

For the logic circuit of FIG. 2, the internal meta-stability events, which as such may give rise to unpredictable state changes, are mainly characteristic of the internal states containing a constant string of length at least 2 that starts immediately after the point where the feedback signal is fed back into the cascade (that is to say, at the beginning of the cascade). By string it is intended a finite length sequence, and a constant string consists of a repeated constant (1 or 0). This is because the state transition where the said constant string should be transformed into its binary complement may not be sustainable by the feedback signal. More precisely, similarly as for the meta-stability of the short cycle of length 2, this happens if the feedback signal has the same binary value and undergoes the same change as the said constant string.

The oscillating output signal OS can thus have a high speed and possess a significant amount of randomness not only at the digital level, but also at the analog level: the output signal OS, more than being a two-valued (voltage or current) purely digital signal, appears to be like a sort of analog noise. Altogether, a high-speed raw random binary sequence RRBS that contains a high amount of entropy per bit is thus obtained at the output of the sampling unit 125. Not only are the obtained randomness properties robust with respect to changes in the statistics of the random variations in the delay of the logic inversion units, but also, in the unlikely event of the total absence of these variations, the resulting raw random binary sequence will at worst possess good pseudo-randomness properties.

Figure 3:
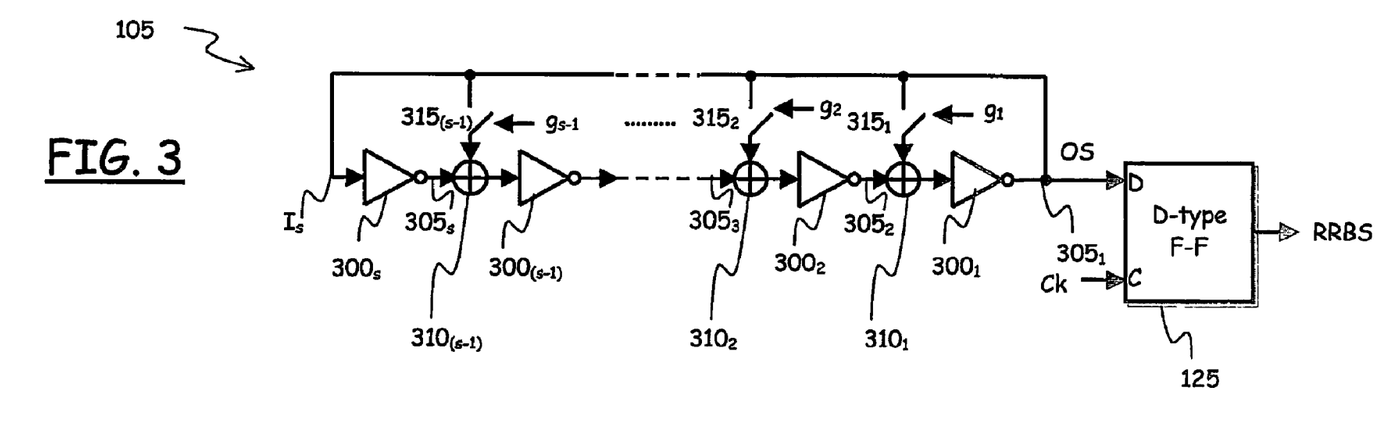
FIG. 3 shows a second possible implementation of the random binary sequence generator, in an embodiment of the present invention.

A second possible practical implementation of the random binary sequence generator 105 is shown in FIG. 3; similarly to the circuit of FIG. 2, a plurality of, e.g., s, logic inversion units $300_s$, $300_{(s-1)}$, ..., $300_2$, $300_1$, are connected in cascade one to another. The output $305_1$ of the last inversion unit $300_1$ in the cascade is directly fed back and forms the input $I_s$ to the first inversion unit $300_s$ (for convenience, the indexes are now given in the reverse order when compared with the configuration depicted in FIG. 2).

In addition to the direct feedback from the output $305_1$ of the last inversion unit $300_1$ to the input $I_s$ of the first inversion unit $300_s$, a plurality of feedback paths from the output $305_1$ of the last inversion unit $300_1$ to the inputs of the inversion units $300_{(s-1)}$, ..., $300_2$, $300_1$ subsequent (downstream) to the first one in the cascade are provided. In particular, the output signal $305_1$ of the last inversion unit $300_1$, in the shown example corresponding to the output signal OS of the raw binary sequence generator, is combined, according to XOR (eXclusive OR) operations (performed for example by two-inputs XOR gates $310_{(s-1)}$, ..., $310_2$, $310_1$), with the output signal $305_s$, ..., $305_3$, $305_2$ of the generic inversion unit $300_s$, ..., $300_3$, $300_2$ so as to produce the input signal to the subsequent inversion unit $300_{(s-1)}$, ..., $300_2$, $300_1$, respectively. Similarly to the circuit of FIG. 2, which ones of the output signals $305_s$, ..., $305_3$, $305_2$ are combined in XOR with the output signal $305_1$ to obtain the input signal to the subsequent inversion unit is determined by the open/closed state of a plurality of switches $315_{(s-1)}$, ..., $315_2$, $315_1$; said open/closed state is specified by the assertion/deassertion of open/closed state control signals $g_{s-1}$, ..., $g_2$, $g_1$: when the generic control signal $g_i$ (i=1, 2, ..., s-1) is a logic "0", the corresponding switch $315_i$ is open and the output signal $305_{i+1}$ is not XOR-ed with the output signal $305_1$ of the last inversion unit $300_1$, being instead directly fed as an input to the subsequent inversion unit $300_i$; on the contrary, when the control signal $g_i$ is a logic "1", the corresponding switch $315_i$ is closed and the output signal $305_{i+1}$ is XOR-ed with the output signal $305_1$ of the last inversion unit $300_1$. In other words, the open/closed state of the switches $315_1$, $315_2$, ..., $315_{(s-1)}$, as specified by open/closed state control signals $g_1$, $g_2$, ..., $g_{s-1}$, determines the type and number of feedback paths from the output of the last inversion unit to the input of the internal inversion units (but the first) in the cascade.

Also in this case, the generic inversion unit $300_i$ may, for example, be formed by an elementary inverter, e.g., a CMOS inverter, or, alternatively, by an odd number of elementary inverters in a series; this latter construction may be in some circumstances preferable, because in this way the designer may individually adjust the transmission delay of the single inversion unit. As in the previously described invention embodiment, the specific construction of the inversion units is however not limitative to the present invention: in general, any circuit acting as an inverting delay unit can be exploited.

It is observed that, similarly to the embodiment of FIG. 2, it is not necessary to materially implement (s−1) selectively activatable feedback paths, the activation of which is individually determined by the open/closed state of the respective switch: the open/closed state control signals $g_1$, $g_2$, ..., $g_{s-1}$ may in fact be regarded as binary-valued coefficients, each coefficient specifying, depending on the respective value, if the associated feedback path is materially provided or not. However, if all the possible feedback paths are provided for, selectively activatable by controlling the respective switches, the circuit results to be configurable, and greater flexibility is ensured.

Furthermore, it is observed that also in this case the output signal OS might in principle be tapped off the output of any other inversion unit in the cascade, not necessarily from the last one.

The circuit of FIG. 3 resembles an LFSR in the Called Galois configuration (so-called Galois LFSR); however, differently from the Galois LFSR, the circuit of FIG. 3 has asynchronous inverting delay units instead of synchronous delay units implemented as synchronously clocked D-type flips-flops. Importantly, the logic inversions operated by the inverting delay units make the circuit of FIG. 3 work in a mathematically different way from the Galois LFSR, even if it is assumed to be operated synchronously.

The feedback paths from the output of the last inversion unit in the cascade to the input of the other inversion units are preferably chosen in order to satisfy the above-mentioned requirement that no fixed points exist in the corresponding state-transition function.

Adopting again the binary polynomial representation of the feedback coefficients in the circuit of FIG. 3, it is obtained:

$$g(x) = \sum_{i=0}^{s} g_i x^i$$

wherein $x^i$ corresponds to the generic output $305_i$, with i=0 to s, the summation is binary (i.e., it is a modulo-2 addition, i.e., an XOR operation), and $g_0 = g_s = 1$.

Analysis of the state-transition function corresponding to the logic circuit with feedback shown in FIG. 3 is conducted by assuming that the circuit is operated in a synchronous manner, i.e., that the logic inversion units $300_1$, $300_2$, ..., $300_s$ operate on the basis of a timing signal, which can be implemented (e.g., in simulations) by introducing a synchronously clocked D-type flip-flop after each logic inversion unit in the cascade.

A mathematical analysis reveals that the circuit of FIG. 3 has no fixed point in the respective state-transition function if and only if the following conditions (in the following simply referred to as "condition $C_G$") are satisfied:

$g(1)=0$ and s is odd.

The above condition $C_G$ equivalently means that the polynomial $g(x)$ is equal to $g(x)=(1+x)k(x)$, for a binary polynomial $k(x)$, and that the degree of the polynomial $g(x)$ is odd.

Further mathematical analysis shows that, provided that the above condition $C_G$ is satisfied, the state-transition diagram of the circuit of FIG. 3, still assumed to be operated in a synchronous manner, contains exactly one short cycle of length 2 if and only if the further condition $k(1)=1$ is satisfied.

The number and the lengths of the longer cycles depend on the polynomial $k(x)$, in a way known in the theory of linear recurring sequences. Preferably, the polynomial k(x) is chosen to be a primitive polynomial, in which case there is only one long cycle of length $2^s-2$. This ensures good pseudo randomness properties of the oscillating output signal OS, including a long period and good statistical properties.

By further mathematical analysis, it can be derived that the short cycle of length 2 is composed of the two states of the following form Let the s inverters be grouped into 2n+1 groups, separated by the effective feedback connections, that is, by the 2n nonzero feedback coefficients (the number has to be even as g(1)=0), and let the inverter output bits define the state vector of the logic circuit with feedback 115. Then, the two states take the forms $c_{n+1}* A_n c_n * A_{n-1} \ldots A_2 c_2 * A_1 c_2 *$ and $-c_{n+1}* A_n -c_n * A_{n-1} \ldots A_2 -c_2 * A_1 -c_1 *$, respectively, where $A_i-$ is an alternating string, $c_i*$ is the constant string obtained by repeating a constant $c_i$, and $-c_i*$ is the constant string defined by the binary complement of $c_i$. All the strings are uniquely determined by the following rule: if $c_1=0$, then the last bit of $A_i$ equals $c_i$ and the first bit of $A_i$ equals the binary complement of $c_{i-1}$. It thus follows that the transition between these two states is meta-stable unless all the constant strings have the same odd length, for example, equal to one. This is because the transition between the constituent constant stings and their binary complements is generally meta-stable (for reasons similar to those already explained in the context of the Fibonacci configuration). In particular, to enhance the meta-stability, when the output signal OS is taken from the last inverter in the cascade, it is thus recommended that the length of the first constant string, $c_1*$, should be even, for example, equal to two (which is equivalent to $g_1=0$ and $g_2=1$).

Also for the logic circuit of FIG. 3, the frequency of the oscillating output signal OS is determined by the total delay of the logic inversion units in the shortest feedback loop, that is, in the loop identified by the smallest index i such that $g_i=1$. Thus, in order to obtain a high-speed output signal OS, it is preferable that such an index i is small, e.g., equal to 2 (provided that $g_1=0$, as suggested above) and that the delay introduced by the individual inverting units is small (in practice, this means that the (odd) number of elementary inverter logic gates forming the logic inversion units is relatively small). In the present embodiment, the inverter delay may be even smaller than in the case of the circuit of FIG. 2, because in that case the feedback signal is produced with a delay, due to a series of XOR gates connected together, which is not present in the circuit of FIG. 3.

As for the logic circuit of FIG. 2, in addition to having good pseudo-randomness properties, the oscillating output signal OS, also exhibits randomness properties, for the reasons discussed in connection with the general logic circuit with feedback 115 of FIG. 1, which are all dinghy applicable to the specific logic circuit of FIG. 3 as well. The argents include the unpredictable variations in the delay of the inverter logic gates, which get propagated and enhanced through feedback, possible internal meta-stability events, and frequent meta-stability events in the sampling D-type flip-flop. Due to different feedback configurations, the induced randomness properties of the logic circuits shown in FIGS. 2 and 3 may be somewhat different, but the main arguments remain the same.

For the logic circuit of FIG. 3, the internal meta-stability events, which as such may give rise to unpredictable state changes, are mainly characteristic of the internal states containing one or more constant strings of length at least 2 that start immediately after the points where the feedback signal is fed back into the cascade so that each such string and the value of the feedback signal are the same and undergo the same change as in the described meta-stable cycle of length 2. This is because the corresponding state transition where the said constant strings should be transformed into their binary complements is then not sustainable by the feedback signal. In this regard, the circuit of FIG. 3 is preferable to that of FIG. 2, because it contains more than just one such point and hence contains a larger number of states prone to meta-stability.

It is again emphasized that while in the circuit configuration of FIG. 3 an odd number of logic inversion units is required, in the circuit configuration of FIG. 2 the number of logic inversion units can be either odd or even.

Figure 4:
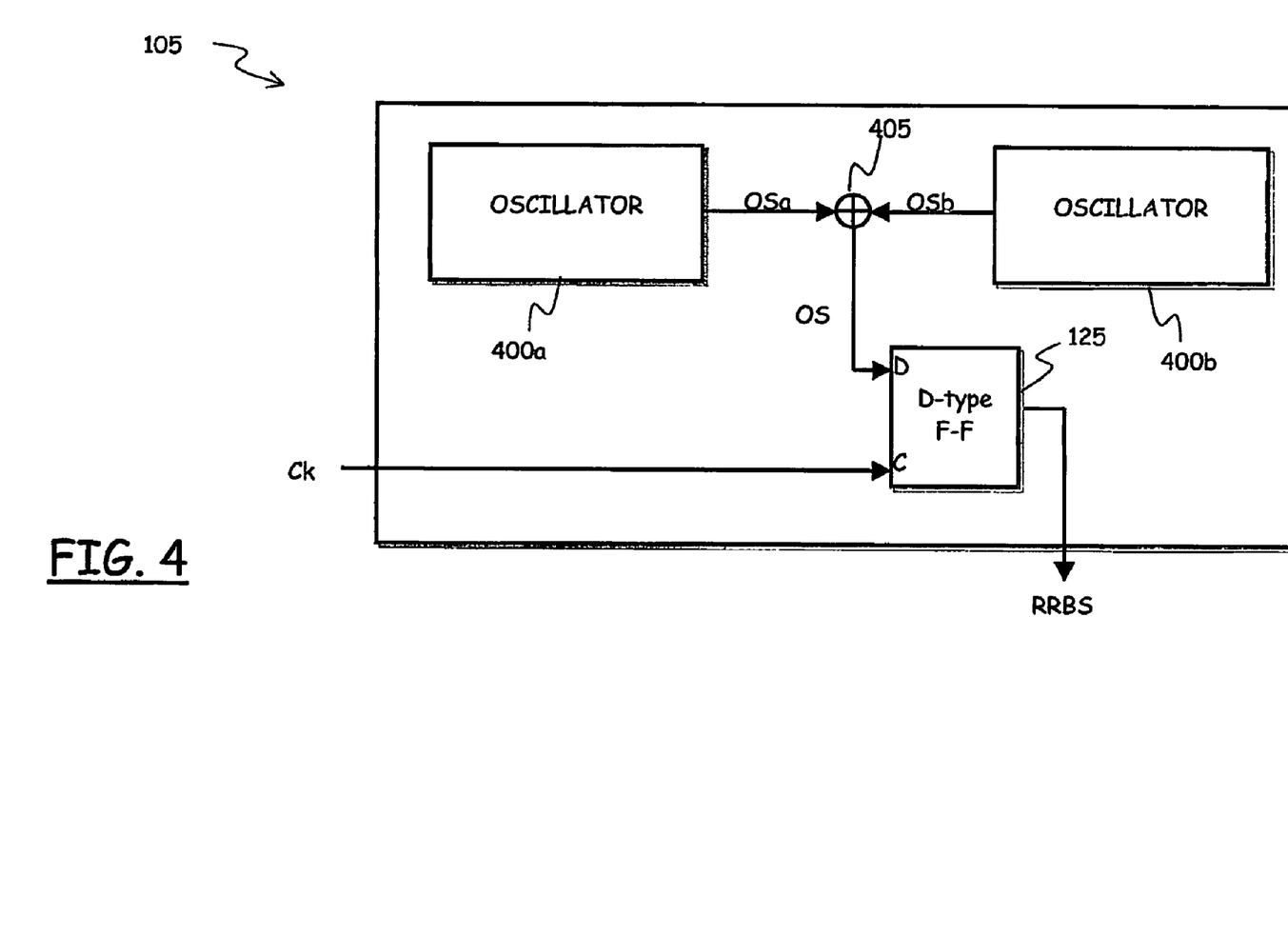
FIG. 4 shows a third possible implementation of the random binary sequence generator, in an embodiment of the present invention.

A further possible implementation of the random binary sequence generator 105 is depicted schematically in FIG. 4. A first and a second oscillators 400a and 400b are exploited, one, e.g., the first oscillator 400a, being of the type shown in FIG. 2 without the sampling unit, and the other, e.g., the second oscillator 400b, being of the type shown in FIG. 3 without the sampling unit. An output sequence OSa of the first oscillator 400a and an output sequence OSb of the second oscillator 400b are combined together, for example, they are bitwise XOR-ed by a two-input XOR gate 405. The resulting output sequence OS is fed to the sampling unit 125, operated by a clock signal Ck, producing the raw binary sequence RBS.

Assuming that the first and second oscillators 400a and 400b are mutually independent, the structure of FIG. 4 further enhances the randomness properties and increases their robustness with respect to changes in the statistics of the random variations in the delay of the logic inversion units. For example, in the unlikely event of the total absence of these variations in one of the oscillators (for example, due to the technological reasons), the resulting raw random binary sequence will at worst possess randomness properties resulting from the other oscillator.

Preferably, the lengths of the two oscillators 400a and 400b, in terms of the numbers of constituent logic inversion units minus one, should be mutually prime, because in this way the period of the corresponding pseudorandom sequence is maximized and the interlocking or coupling effect is minimized. In particular, the lengths can differ only by one, where the even length corresponds to the oscillator 400a.

Merely by way of example, in a practical implementation of the solution presented in FIG. 2, the binary polynomial f(x) may be:

$$f(x)=1+x^2+x^4+x^5+x^{12}+x^{13}+x^{15}+x^{16}+x^{18}+x^{20}$$

with the generic logic inversion unit $200_1, 200_2, \ldots, 200_r$, being composed of five elementary inverters. The corresponding long cycle then has length $2^{20}-2$. For the solution proposed in FIG. 3, the binary polynomial may be:

$$g(x)=1+x^2+x^3+x^7+x^{16}+x^{17}+x^{19}+x^{21}$$

with the generic logic inversion units $300_1, 300_2, \ldots, 300_s$ being composed of three elementary inverters. The corresponding long cycle then has length $2^{21}-2$. The long cycle for the XOR combination of the two oscillators then has length $2(2^{19}-1)(2^{20}-1)$. The ring oscillator forming the clock generator 130 that generates the sampling clock Ck is composed of eleven elementary inverters.

It is observed that other combinations of the oscillator strides of FIGS. 2 and 3 are also possible; more generally, a raw binary sequence generator may be constructed combining one or more oscillator structures of the type shown in FIG. 2 and/or one or more oscillator structures of the type shown in FIG. 3.

The Applicant conducted experimental trials exploiting the FPGA technology, and such trials confirmed the capability of the raw random binary sequence generator according to the embodiment of FIG. 4, as well as of the individual oscillator structures shown in FIGS. 2 and 3 considered per-se, respectively, to generate high-speed and high-entropy rate raw random binary sequences, even if the oscillator lengths are relatively small. In particular, the amount of randomness for the same speed is orders of magnitude higher than for classical ring oscillators, where the randomness is mostly due to the digital jitter. The evaluation was conducted by statistical tests and by examination of the underlying signals on a logic analyzer.

Thanks to the present invention, high-speed and high-entropy rate raw random binary sequences with robust randomness properties can be generated, by using only logic gates in digital semiconductor technology. A random number generator according to an embodiment of the present invention can be rather easily implemented exploiting standard components, such as logic gates, and is suitable for integration in both FPGA (Field Programmable Gate Array) and ASIC (Application Specific Integrated Circuit) technologies; in particular, standard digital library units can be directly exploited, and the result is practically independent of the fabrication technology.

The invention claimed is:

1. A random binary sequence generator for generating a random binary sequence adapted to be used for producing random numbers, comprising:
at least one logic circuit with a set of logic circuit inputs and a set of logic circuit outputs wherein:
said at least one logic circuit comprises a plurality of asynchronous logic inversion units connected in cascade one to another, respectively;
said plurality of asynchronous logic inversion units comprises a first and a last asynchronous logic inversion unit in the cascade, said set of logic circuit outputs comprising an output of the last asynchronous logic inversion unit and said set of logic circuit inputs comprising an input of the first asynchronous logic inversion unit, said at least one logic circuit comprising a first feedback path from the output of the last asynchronous logic inversion unit to the input of the first asynchronous logic inversion unit;
said at least one logic circuit is operated without a clock signal and autonomously by connecting said logic circuit outputs to said logic circuit inputs; and
said at least one logic circuit implements a set of Boolean functions, each of said logic circuit outputs having a value defined by a respective Boolean function of at least one of said logic circuit inputs, said respective Boolean function belonging to said set of Boolean functions;
and wherein:
said logic circuit outputs represent states of said at least one logic circuit;
said set of Boolean functions forms a state-transition function defining transitions of said states, wherein said states are arranged so as to form at least one cycle of states, said at least one cycle of states having a cycle length equal to a number of states included therein;
said at least one cycle of states has a minimum length equal to two; and
in case the cycle length is two, said at least one cycle of states is meta-stable for said at least one logic circuit operated without a clock signal and autonomously.

2. The random binary sequence generator according to claim 1, wherein the number of said logic circuit inputs is equal to the number of said logic circuit outputs.

3. The random binary sequence generator according to claim 1, wherein in case the at least one cycle of states is a non meta-stable cycle, the minimum cycle length is three.

4. The random binary sequence generator according to claim 1, further comprising at least one output logic circuit operatively connected to at least one of said logic circuit outputs of the at least one logic circuit, the output logic circuit having an output for providing an output signal by implementing an output Boolean function.

5. The random binary sequence generator according to claim 4, wherein said at least one of said logic circuit outputs has a value that is not constant.

6. The random binary sequence generator according to claim 4, further comprising a sampling circuit for sampling said output signal.

7. The random binary sequence generator according to claim 1, wherein said plurality of asynchronous logic inversion units comprises at least one intermediate asynchronous logic inversion unit in the cascade, wherein said at least one logic circuit comprises at least one second feedback path from an output of a respective asynchronous logic inversion unit in the cascade to the input of the first asynchronous logic inversion unit, wherein said respective asynchronous logic inversion unit is chosen from the group of the first asynchronous logic inversion unit and the at least one intermediate asynchronous logic inversion unit.

8. The random binary sequence generator according to claim 7, wherein the at least one logic circuit further comprises an XOR logic combination of the first and the at least one second feedback paths.

9. The random binary sequence generator according to claim 8, wherein said at least one second feedback path comprises a plurality of second feedback paths.

10. The random binary sequence generator according to claim 9, wherein the at least one logic circuit has an associated binary polynomial f(x) defined as:

$$f(x) = \sum_{i=0}^{r} f_i x^i$$

wherein $x^i$ corresponds to the output of the $i^{th}$ asynchronous logic inversion unit in the cascade, $f_i$ is a feedback coefficient associated with the $i^{th}$ asynchronous logic inversion unit and indicative of the presence of the $i^{th}$ of said plurality of second feedback paths from said output of the $i^{th}$ inversion unit to the input of the first inversion unit, the summation being a binary addition, and the binary polynomial f(x) satisfying the conditions:

$$f(x)=(1+x)h(x)$$

and $$h(1)=1.$$

11. The random binary sequence generator according to claim 1, wherein said plurality of asynchronous logic inversion units comprises at least one intermediate asynchronous logic inversion unit in the cascade, and said at least one logic circuit comprises at least one second feedback path from said output of the last asynchronous logic inversion unit to an input of a respective asynchronous logic inversion unit, said respective asynchronous logic inversion unit being chosen from the group of the at least one intermediate asynchronous logic inversion unit and the last asynchronous logic inversion unit in the cascade.

12. The random binary sequence generator according to claim 11, wherein the at least one logic circuit further comprises an XOR logic combination of said at least one second feedback path and the output of a preceding asynchronous logic inversion unit that precedes said respective asynchronous logic inversion unit where said at least one second feedback path terminates.

13. The random binary sequence generator according to claim 12, wherein said at least one second feedback path comprises a plurality of feedback paths.

14. The random binary sequence generator according to claim 13, wherein the at least one logic circuit has an associated binary polynomial g(x) defined as:

$$g(x) = \sum_{i=0}^{s} g_i x^i$$

wherein $x^i$ corresponds to the output of the $i^{th}$ asynchronous logic inversion unit in the cascade, $g_i$ is a feedback coefficient associated with the $i^{th}$ asynchronous logic inversion unit and indicative of the presence of the $i^{th}$ of said plurality of second feedback paths from said output of the last inversion unit to the input of the $i^{th}$ inversion unit, the summation being a binary addition, and the binary polynomial g(x) satisfying the conditions:

$g(x)=(1+x)k(x)$ with s being odd.

15. The random binary sequence generator according to claim 14, wherein the binary polynomial g(x) satisfies the further condition:

$k(1)=1$.

16. The random binary sequence generator according to claim 1, wherein each of said asynchronous logic inversion units comprises a predetermined odd number of logic inverters.

17. The random binary sequence generator according to claim 1, wherein the state-transition function is an affine transformation, affine with respect to the binary field.

18. The random binary sequence generator according to claim 17, wherein the generic element of the at least one logic circuit is selected from the group of binary complement elements, binary identity elements and binary addition elements.

19. The random binary sequence generator according to claim 6, wherein the sampling circuit operates according to a timing signal.

20. The random binary sequence generator according to claim 19, wherein the sampling circuit comprises a D-type flip-flop.

21. The random binary sequence generator according to claim 4, wherein said at least one logic circuit comprises at least a first and a second logic circuit having respective output logic circuits operatively connected thereto, the output logic circuits having each a respective output for providing an output signal.

22. The random binary sequence generator according to claim 21, further comprising a combination of the output signals of the output logic circuits for producing a combined output signal.

23. A random number generator comprising the random binary sequence generator according to claim 1, for generating a raw random binary sequence, and a post-processing circuit adapted to be fed with the raw random binary sequence for processing it, so as to produce a purely random binary sequence.

24. A method of generating a random binary sequence adapted for producing random numbers, comprising:
  providing at least one logic circuit having a set of logic circuit inputs and a set of logic circuit outputs, wherein:
    said at least one logic circuit comprises a plurality of asynchronous logic inversion units connected in cascade one to another, respectively;
    said plurality of asynchronous logic inversion units comprises a first and a last asynchronous logic inversion unit in the cascade, said set of logic circuit outputs comprising an output of the last asynchronous logic inversion unit and said set of logic circuit inputs comprising an input of the first asynchronous logic inversion unit, said at least one logic circuit comprising a first feedback path from the output of the last asynchronous logic inversion unit to the input of the first asynchronous logic inversion unit;
  the at least one logic circuit implements a set of Boolean functions, each of said logic circuit outputs having a value defined by a respective Boolean function of at least one of said logic circuit inputs, said respective Boolean function belonging to said set of Boolean functions;
  said set of Boolean functions forms a state-transition function defining transitions of said states, wherein said states are arranged so as to form at least one cycle of states, the at least one cycle of states having a cycle length equal to a number of states included therein; and
  said at least one cycle of states has a minimum length equal to two; and
  in case the cycle length is two, said at least one cycle of states is meta-stable for said at least one logic circuit operated without a clock signal and autonomously;
  operating the logic circuit autonomously by feeding back the set of logic circuit outputs to said logic circuit inputs; and
  operating the logic circuit without a clock signal.

25. The method according to claim 24, wherein the number of said logic circuit inputs is equal to the number of said logic circuit outputs.

26. The method according to claim 24, wherein in case the at least one cycle of states is a non meta-stable cycle, the minimum cycle length is three.

27. The method according to claim 24, further comprising generating an output signal from said set of logic circuit outputs and sampling said output signal.

28. The method according to claim 27, wherein said sampling comprises providing a timing signal, feeding the output signal to a sequential circuit element, and using the timing signal to clock the sequential circuit element.

29. The method according to claim 28, wherein said generating an output signal comprises providing at least a first and a second logic circuit having respective output signals, and obtaining said output signal by combining the respective output signals.

* * * * *